United States Patent [19]
Uenishi et al.

[11] Patent Number: 5,208,450
[45] Date of Patent: May 4, 1993

[54] IC CARD AND A METHOD FOR THE MANUFACTURE OF THE SAME

[75] Inventors: Mitsuaki Uenishi, Takatsuki; Yoshihisa Takase, Higashiosaka; Takashi Fujii, Katano, all of Japan

[73] Assignee: Matsushita Electric Industrial Co., Ltd., Osaka, Japan

[21] Appl. No.: 777,457

[22] Filed: Oct. 16, 1991

Related U.S. Application Data

[63] Continuation of Ser. No. 445,659, Dec. 15, 1989, abandoned.

[30] Foreign Application Priority Data

| Apr. 20, 1988 | [JP] | Japan | 63-97071 |
| Apr. 20, 1988 | [JP] | Japan | 63-97076 |
| Apr. 21, 1988 | [JP] | Japan | 63-98661 |
| Apr. 19, 1989 | [WO] | PCT Int'l Appl. | PCT/JP89/00418 |

[51] Int. Cl.⁵ .................... G06K 19/06; G06K 19/02
[52] U.S. Cl. .................... 235/492; 235/488
[58] Field of Search ............ 235/441, 488, 492

[56] References Cited

U.S. PATENT DOCUMENTS

| 4,374,457 | 2/1983 | Wiech, Jr. | 361/401 |
| 4,544,989 | 10/1985 | Nakabu et al. | 361/401 |
| 4,670,770 | 6/1987 | Tai | 357/74 X |
| 4,764,803 | 8/1988 | Ueda | 357/72 |

FOREIGN PATENT DOCUMENTS

| 57-210494 | 12/1982 | Japan . |
| 58-92597 | 6/1983 | Japan . |
| 58-135656 | 8/1983 | Japan . |
| 62-103195 | 5/1987 | Japan . |

Primary Examiner—Eugene R. LaRoche
Assistant Examiner—Michael C. Kessell
Attorney, Agent, or Firm—Panitch Schwarze Jacobs & Nadel

[57] ABSTRACT

In an IC card of the invention, an IC module (3) is adhered to a first concave (9) of a card base (1) by means of an adhesive (7) and a gap (8) is formed between the outside surface of the IC module (3) and the inside surface of the first concave (9), the gap being wider in the inside upper part and narrower in the inside lower part of the first concave (9), so that the IC chip in the IC module (3) and the card base (1) can be protected from damages caused by bending of the the card base (1).

2 Claims, 8 Drawing Sheets

IC CARD AND A METHOD FOR THE MANUFACTURE OF THE SAME

This application is a continuation of Ser. No. 445,659, filed Dec. 15, 1989, abandoned.

TECHNICAL FIELD

This invention relates to an IC card and a method for manufacturing the IC card, which has an IC module incorporating an IC chip that processes or stores data, can exchange data with external devices, and can be carried and used as a cash card, credit card, identification card or the like.

BACKGROUND ART

A so-called IC card, which incorporates an IC module containing an IC chip having a microcomputer and memories therein and having a series of connection terminals for exchanging data with external devices buried in a card base, is widely known, and its standardization is in process at the ISO (International Organization for Standardization). In comparison with conventional magnetic stripe cards, since such IC cards have a larger memory capacity and are superior in security, practical usages are considered in many fields such as financial businesses, medical institutes and personal identification. The portability of the IC cards are greatly advantageous like that of conventional magnetic stripe cards. Therefore, to put the IC cards into practical use, the reliability must be securely guaranteed in the environment where the IC cards are used, that is, resistance to bending of IC card and protection of the incorporated IC chip from external stresses. Nowadays, this is an important problem.

As a conventional example, a sectional view of an IC card in Japanese Laid-open Patent Publication No. 58-92597 is shown in FIG. 8. This IC card is constructed by an IC module 32 incorporating an IC chip and having connection terminals 34 with external devices which are adhered inside of a concave 33 formed in a specified position on a card base 31 with an adhesive 35. An IC card having such a construction is produced by punching out a card base 31 in a desired size, forming a concave 33 with a size similar to an IC module 32 in a desired position, disposing the IC module 32 inside of the concave 33 of the card base 31 by using the adhesive 35 in such a way that the surface of the connection terminals 34 is flush with the surface of the card base 31.

However, in such conventional IC cards, when the both ends of the card base 31 are bent upward, the inside surface of the concave 33 strongly presses the IC module 32 inward by means of the adhesive 35, so that the IC chip incorporated in the IC module 32 might be damaged. If the IC chip is protected from the bending stress of IC card by increasing the rigidity of the IC module 32, even when the IC module 32 is pressed by the inside surface of the concave 33, because the IC module 32 is rigid, it does not change its form, and reversely, the bending stress of the card base 31 is centralized on the boundary portion between the inside surface and the inside bottom surface of the concave 33, thereby damaging the card base 31 at the boundary portion.

DISCLOSURE OF THE INVENTION

It is hence a primary object of the invention to present an IC card in which the IC chip in the IC module and the card base are not damaged even when the IC card is bent.

In order to achieve the object, an IC card of the invention comprises a card base, an IC module equipped in the first concave formed in this card base, and an adhesive adhering the IC module onto the inside bottom surface of the first concave, wherein a gap is formed between the inside surface of the first concave and the outside surface of the IC module, said gap being wider at the inner upper part of the first concave and narrower at the inner lower part of the first concave. In such a construction of the IC card, even when the both sides of the card base are bent upward, owing to the presence of a gap between the inside surface of the first concave and the outside surface of the IC module, the inside surface of the first concave does not press the IC module inward. Therefore, the IC chip and the card base itself are not damaged when the card base is bent.

BEST MODE FOR CARRYING OUT THE INVENTION

Figure 1A:
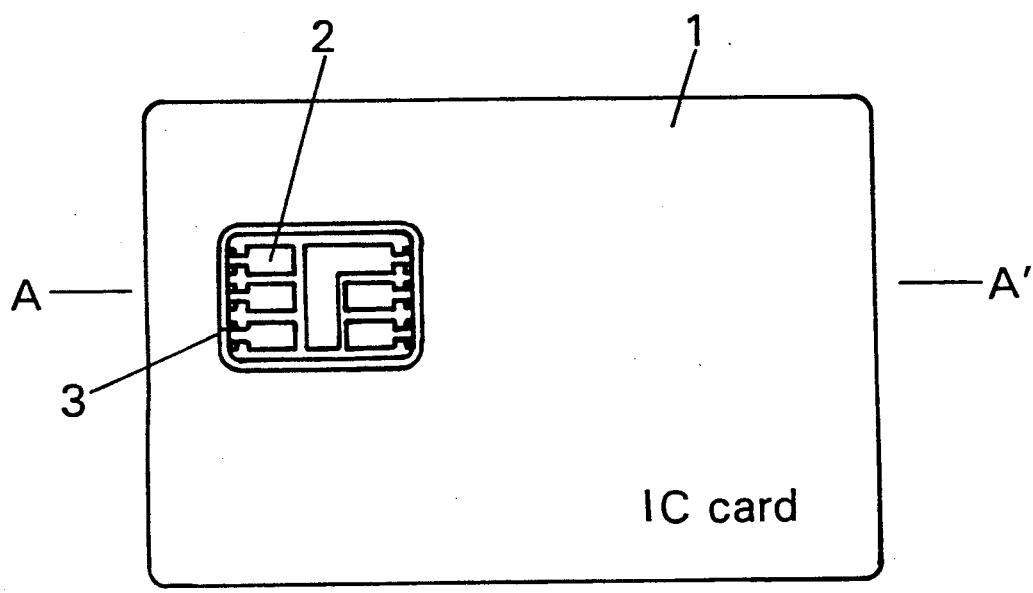
FIGS. 1a and b are a top view showing an IC card of this invention and a sectional view along line A—A' of FIG. 1a, FIG. 2 is a sectional view showing an IC module used in an IC card of the invention.

Referring to the drawings, one of the embodiments of the invention is described in detail below. FIGS. 1 and 2 show one embodiment of the invention. As shown in FIG. 2, an IC module 3 incorporating an IC chip 10 and having a series of connection terminals 2 to exchange data with external devices is positioned in a first concave 9 that is formed in a specified position of a card base 1 shown in FIG. 1 in such a manner that the surface of each connection terminal 2 is flush with the surface of the card base 1. The IC module 3 in such a state is adhered to the inside bottom part of the first concave 9 by means of an adhesive 7. The card base 1 is composed of two center cores 5a and 5b made of white colored rigid vinyl chloride resin and two over-sheets 4a and 4b made of transparent vinyl chloride resin that are disposed on the surfaces of the center cores 5a and 5b, respectively. Between the center core 5a and the over-sheet 4a, and between the center core 5b and the over-sheet 4b, although not shown in FIG. 1a, desired letters and patterns 6a and 6b which are visible through the over-sheets 4a and 4b are formed by a printing technique. The thickness of the center cores 5a and 5b are both 0.35 mm, that of over-sheets 4a and 4b are both 0.03 mm, the overall thickness of the card base 1 is 0.76 mm, and the overall dimensions are the same as credit cards. As shown in the sectional view in FIG. 2, the IC module 3 used in this IC card comprises a connection terminal 2 composed of a metallic thin plate, one surface of which is exposed outside and on the other surface an IC chip 10 that processes or stores data is mounted with an insulating adhesive 11. The IC chip 10 is connected to the connection terminal 2 by a metallic wire 12, and these members are covered with a sealing resin 13 made of an epoxy resin. By the transfer molding method, the IC chip 10 and the peripheral members (adhesive 11, metallic wire 12, sealing resin 13 and connection terminal 2) are molded into one body. The overall dimensions of this IC module 3 are 10.2×12.4 mm, and the thickness is 0.59 mm. The IC chip 10 works by connecting five out of six connection terminals 2, which are exposed on the surface of the IC module 3 as shown in FIG. 1a, to an external device.

Figure 1B:
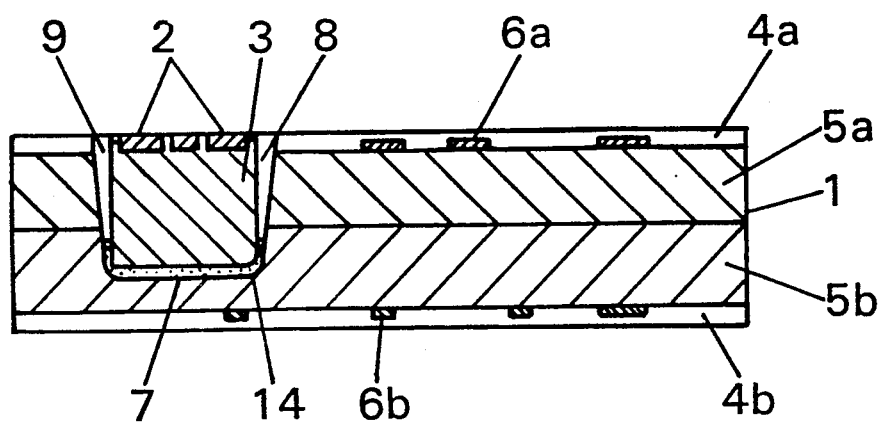
Figure 2:
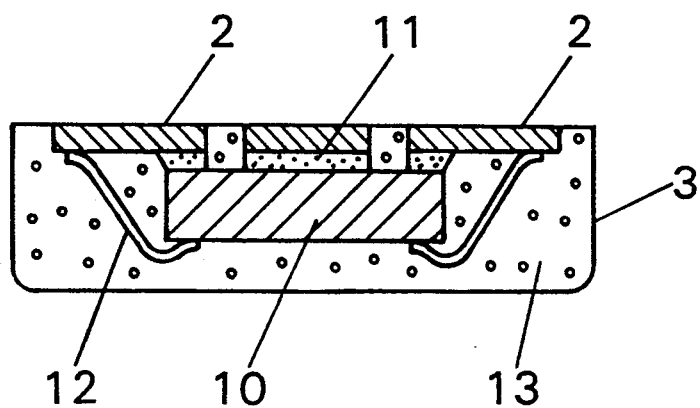

As shown in FIG. 1b, the inside surface of the first concave 9 formed in the card base 1 continuously inclines inward toward the inside bottom surface of this first concave 9, and between the inside surface of the first concave 9 and the outside surface of the IC module 3 adhered to the inside bottom surface of the first concave 9, there is formed an inclined gap 8 which is wider at the inner upper part of the first concave 9 and narrower at the inner lower part of the first concave 9. In an IC card having such a construction, in the case that the both sides of the card base 1 are bent downward, the gap 8 between the inside surface of the first concave 9 and the outside surface of the IC module 3 simply opens and the inside surface of the first concave 9 does not press the outside surface of the IC module 3 inward, so that a bending stress does not work on the IC module 3. Reversely, in the case that the both sides of the card base 1 are bent upward, the inside surface of the first concave 9 changes positions more at the inner upper part of the first concave 9 and less at the inner lower part thereof, centering around the boundary portion 14 of the said inside surface and the said inside bottom surface, and comes very close to the outside surface of the IC module 3. Since the inclined gap 8 which is wider at the inner upper part of the first concave 9 and narrower at the inner lower part is formed between the inside surface of the first concave 9 and the outside surface of the IC module 3, so long as the card base 1 is exceedingly bent, the inside surface of the first concave 9 and the outside surface of the IC module 3 do not directly contact. Therefore, a bending stress of the card base 1 does not work on the IC module 3. In a portion of the card base 1 that is close to the boundary portion 14 of the inside surface and the inside bottom surface of the first concave 9, a tension or a bending stress which may be created in the case that the inside surface of the inner upper part of the first concave 9 and the outside surface of the IC module 3 contact each other is not generated. Thus, even if both sides of the card base 1 are bent either upward or downward, the IC module 3 and the card base 1 are protected from the bending stress.

As a result of our various experiments, it is proved that by forming the inside surface of the first concave 9 at an inclination of 10 deg., against the perpendicular and setting the internal angle between the inside surface of the first concave 9 and the outside surface of the IC module 3 at 10 deg., the IC module 3 and the card base 1 are protected at a practical level against a bending of the IC card. The inner dimensions of the inside bottom surface of the first concave 9 are set at 10.28×12.48 mm, taking the allowance of the inner dimensions and the allowance of the outer dimensions of the IC module 3 in consideration, and the depth of the first concave 9 is set so that the thickness of the remaining part of the card base 1 at the lower inside bottom surface of the first concave 9 becomes 0.15 mm. The thickness of the remaining part of the card base 1, 0.15 mm, is composed of a thickness 0.03 mm of the over-sheet 4b and the remaining thickness 0.12 mm of the center core 5b, and this composition is an important factor that determines durability and strength of the card base 1 against bending, as the thickness of the card base 1 is the smallest.

Then, as comparison examples, IC cards were produced by setting the remaining thickness 0.15 mm of the card base 1 to be constant and changing the thickness of the over-sheet 4b from 0.03 mm of the embodiment to 0.05 mm and 0.08 mm. The results of examining the durability of the IC cards against bending are shown in Table 1 below. The bending test was performed by bending the shorter edges of the IC cards downward with an amplitude of 10 mm at a speed of 30 times per minute, and the number of times of bending until a crack occurred in the card base 1 at the lower inside bottom surface of the first concave 9 were evaluated.

TABLE 1

| Evaluation items | Thickness of over-sheet | | |
|---|---|---|---|
|  | 0.03 mm | 0.05 mm | 0.08 mm |
| Average value | 1310 | 799 | 622 |
| Standard deviation | 244 | 91 | 171 |

As shown in Table 1, an IC card of the embodiment with the over-sheet 4b of 0.03 mm in thickness has the largest bending durability. In addition, the transparent over-sheets 4a and 4b of 0.03 mm are useful in that the letters and patterns 6a and 6b are clearly visible therethrough. The use of the over-sheets 4a and 4b with a thickness of less than 0.03 mm is not desired because they do not protect the letters and patterns 6a and 6b and they are inferior in handling. As the adhesive 7 that adheres the bottom surface of the IC module 3 to the inside bottom surface of the first concave 9, a silicone resin adhesive, the main ingredient of which is a denaturated polymer of silicone having a rubbery elasticity even after it is hardened, was used. As the denaturated polymer of silicone, for example, a silicone resin denaturated by the addition of an epoxy resin with elasticity was used, the epoxy resin being obtained by the addition of an amine adduct of polypropylene glycol glycidyl ether to a bisphenol epoxy resin. As comparison examples, IC cards were produced by using, instead of the adhesive 7 with a rubbery elasticity, an epoxy resin adhesive containing denaturated polyamine hardener and an acrylic resin adhesive as adhesives having some flexibility but not rubbery elasticity after hardening, and the mechanical characteristics (bending characteristics, twisting characteristics, shock-resistance) of the IC cards were evaluated. The evaluation results are shown in Table 2. In Table 3, the results of environmental experiment of IC cards of this embodiment are shown. The IC cards of the embodiment have no problem with mechanical strength, chemical resistance, humidity resistance and water resistance, and have a sufficient reliability.

TABLE 2

| Adhesive | Embodiment Silicone resin with a denaturated polymer of silicone as its main ingredient | Comparative example Epoxy resin | Comparative example Acrylic resin |
|---|---|---|---|
| Bending characteristics *1) | 2300 times or more | 250 times or more | 300 times or more |
| Twisting characteristics *2) | OK | NG | NG |
| Shock- | ○ | X | X |

TABLE 2-continued

| Adhesive | Embodiment Silicone resin with a denaturated polymer of silicone as its main ingredient | Comparative example Epoxy resin | Comparative example Acrylic resin |
|---|---|---|---|
| resistance | | | |

*1) Bending characteristics; experimented by bending the cards in the shorter direction and the longer direction on both faces of the cards, top and bottom, and right and left.
Longer direction; flexibility (f): 20 mm, periodicity; bending for 30 times/min
Shorter direction: flexibility (f): 10 mm, periodicity; bending for 30 times/min
Neither the function of a card is lost after the bending test nor remarkable cracks arise.
*2) Twisting characteristics; When the IC card is twisted with ±15 deg., 30 times/min and 1,000 times, around the axis in the longitudinal direction, the IC module is not peeled off, remarkable cracks do not arise and IC performance is still normal.

TABLE 3

| Item | Sodium carbonate 1% 24 Hr | Brine 5% 24 Hr | Acetic acid 5% 24 Hr | Alcohol 100% 24 Hr | Hot water 60° C. 1 Hr | Humidity resistance 74 Hr | Heat-shock 24 c/s | Dropping 1.5 m |
|---|---|---|---|---|---|---|---|---|
| Embodiment | ○ | ○ | ○ | ○ | ○ | ○ | ○ | ○ |

In the IC card of the embodiment, since the adhesive 7 has a rubbery elasticity even after hardening, outside stress and shock are weakened by this adhesive 7, and thus, even when bending, twists and shocks are applied to the card base 1, the IC module 3 was not peeled off from the first concave 9, neither cracks occurred in the card base 1 nor abnormal operating performance of the IC chip 10 was caused. In the IC card of the embodiment, it is considered that a small amount of the adhesive 7 between the bottom surface of the IC module 3 and the inside bottom surface of the first concave 9 invades into the gap 8 between the outside surface of the IC module 3 and the inside surface of the first concave 9, but as shown in Table 2, the phenomenon has no effect on the mechanical characteristics of the IC card.

Figure 3:
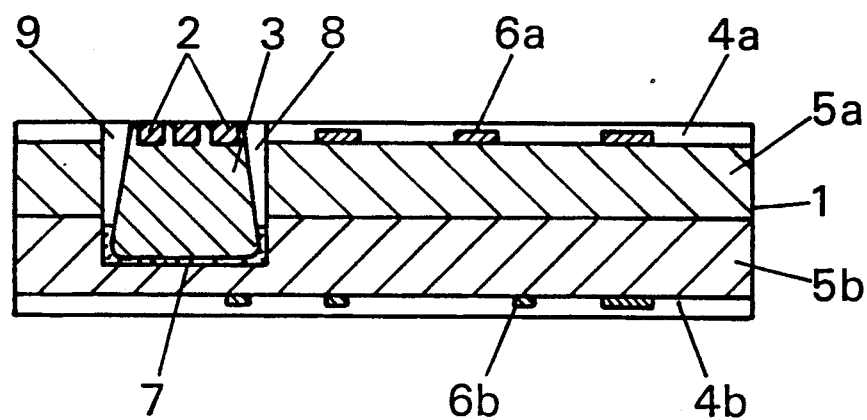
FIGS. 3, 4 and 5 are sectional views showing other IC cards of the invention, FIGS. 6a, b
Figure 4:
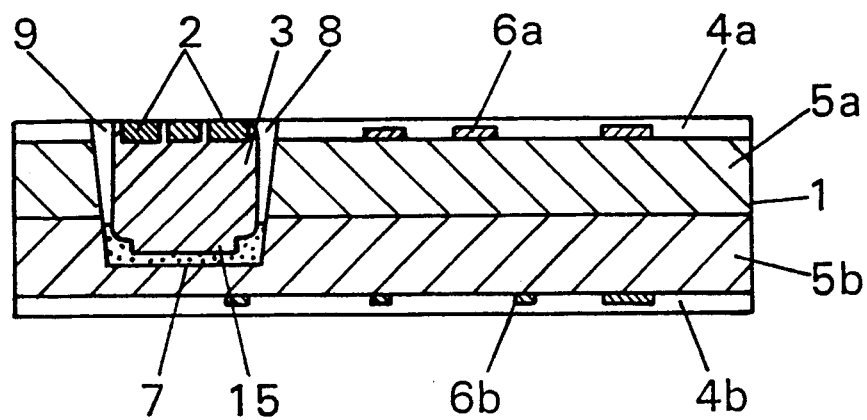
Figure 5:
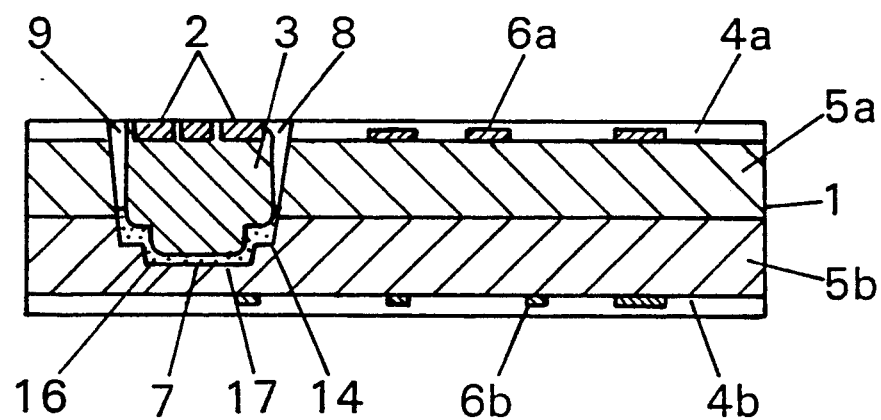

FIGS. 3 to 5 show sectional views of other embodiments of the invention. In the embodiment of FIG. 3, the outside surface of the IC module 3 is inclined outward toward a lower portion, so that an inclined gap 8 which is wider at the inside upper part of the first concave 9 and narrower at the inside lower part is formed between the inside surface of the first concave 9 and the outside surface of the IC module 3. The bottom surface of the IC module 3 is adhered to the inside bottom surface of the first concave 9 by means of an adhesive having a rubbery elasticity even after hardening. It is evident from the embodiment of FIG. 1 that the IC module 3 and the card base 1 of the inside bottom surface of the first concave 9 are protected from bending stresses even when the card base 1 is bent upward or downward. Of course, when the outside surface of the IC module 3 is made wide outward toward a lower portion thereof and the inside surface of the first concave 9 is inclined inward toward the bottom surface of the first concave 9, a linearly inclined gap 8 which is wider at the inside upper part of the first concave 9 and narrower at the inside lower part is formed between the inside surface of the first concave 9 and the outside surface of the IC module 3, and thus, the reliability of the IC card against bending stress is further improved.

In the embodiment of FIG. 4, an inclination is constructed inward in the direction of the inside bottom surface of the first concave on the inside surface of the first concave 9, and an inclined gap 8 which is wider at the inside upper part and narrower at the inside lower part of the first concave 9 is formed between the inside surface of the first concave 9 and the outside surface of the IC module 3. A convex 15 is formed in the middle of the bottom surface of the IC module 3, and the bottom surface of the IC module 3 and the inside bottom surface of the first concave 9 are adhered by means of an adhesive 7 having a rubbery elasticity even after hardening. The thickness of the adhesive 7 on the bottom surface of the IC module 3 is larger at the peripheral part than the center part where the convex 15 is formed. It is effective to increase the thickness of the adhesive 7 in order to prevent the IC module 3 from peeling off from the first concave 9 in the case that both sides of the base 1 are bent downward. The adherence itself increases as well as its expandability with an increase in the thickness of the adhesive 7, so that the IC module 3 can be stably held inside of the first concave 9. It is more important to increase the thickness of the adhesive 7 at the peripheral part than at the center part of the bottom surface of the IC module 3 in order that the IC module 3 is stably held inside of the concave without peeling off in the initial stage. In the embodiment of FIG. 4, the height of the convex 15 on the bottom surface of the IC module 3 is set at 0.02 mm, and the thickness of the adhesive 7 is formed to be 0.02 mm in the center part of the bottom surface of the IC module 3 and 0.04 mm in the peripheral part. In order to increase the thickness of the adhesive 7, it is required to decrease the thickness of the IC module 3 or the thickness of the remaining portion of the card base 1 that faces the inside bottom surface of the first concave 9, but it deteriorates the mechanical strength of the IC module 3 or the card base 1. However, in the IC card shown in the embodiment of FIG. 4, it is possible to increase the thickness of the adhesive 7 without decreasing the thickness of the center part of the IC module 3 in which the IC chip is incorporated, and it enables to improve the initial exfoliation strength between the IC module 3 and the card base 1 without deteriorating the rigidity of the IC module 3. Moreover, even if the thickness of the adhesive 7 between the convex 15 on the bottom surface of the IC module 3 and the inside bottom surface of the first concave 9 is reduced, the thickness of the adhesive 7 between the peripheral part of the bottom surface of the IC module 3 and the inside bottom surface of the first concave 9 can be obtained so that the IC module 3 is stably held inside of the first concave 9, which creates no problem.

In the embodiment of FIG. 5, a first concave 9 is formed at a specified position in the card base 1, and a second concave 16 is formed in the inside bottom surface of the first concave 9. The inside surfaces of both the first concave 9 and the second concave 16 are inclined inward toward the inside bottom surfaces of the first concave 9 and the second concave 16, respectively. Therefore, between the inside surfaces of the first concave 9 and the outside surface of the IC module 3 and between the second concave 16 and the convex 17 of the IC module that is positioned in the second concave 16, an inclined gap 8 which is wider in the inside upper part and narrower in the inside lower part of each of the first concave 9 and the second concave 16 is formed. In the center part of the bottom surface of the IC module 3, a convex 17 that is positioned in the second concave 16 is formed, and the bottom surface of the IC module 3 is adhered to the inside bottom surfaces of the first concave 9 and the second concave 16 by means of an adhesive 7 having a rubbery elasticity even after hardening. The height of the convex 17 on the bottom surface of the IC module 3 is 0.1 mm, the thickness of the remaining portion of the card base 1 that faces the lower inside bottom surface of the first concave 9 is 0.25 mm, the thickness of the remaining portion of the card base 1 that faces the lower inside bottom surface of the second concave 16 is 0.15 mm, the thickness of the adhesive 7 between the inside bottom surface of the first concave 9 and the bottom surface of the IC module 3 is 0.02 mm, and the thickness of the adhesive 7 between the inside bottom surface of the second concave 16 and the convex 17 is 0.02 mm. In this construction, since the card base 1 is bent around the boundary portion 14 between the inside surface of the first concave 9 and the inside bottom surface of the first concave 9, even in the case that the inside surface of the first concave 9 is not brought into contact with the outside surface of the IC module 3, a bending stress is generated on a portion of the card base 1 in the vicinity of the boundary portion 14. However, in the IC card of the embodiment of FIG. 5, because the thickness of the remaining portion of the card base 1 in the vicinity of the boundary portion 14 can be made larger than that of the embodiment of FIG. 3 and the area of the inside bottom surface of the second concave 16 can be decreased as much as possible where the thickness of the card base is the smallest, the mechanical strength and the durability of the card base 1 against the bending stress can be improved. This effect is especially effective when the both sides of the IC card are bent downward. With an IC card having both IC module 3 and magnetic stripes, data in the magnetic stripes can be read by inserting the IC card into a reading device such as ATM. Rollers for conveying a cash card of an existing ATM drive in the center part of the cash card, and in the IC card approved by ISO, the rollers driving the IC card run over the IC module 3. Therefore, a large load is generated especially in the peripheral part of the IC module 3, and the card base 1 of the bottom part of the IC module 3 might be damaged. However, when an IC card such as that of the embodiment of FIG. 5 is formed, the thickness of the card base 1 can be made larger in the peripheral part of the bottom surface of the IC module 3 and it withstands the load of the rollers for driving IC cards. That is, the IC card is superior in durability.

Moreover, since the convex 17 in the center part of the IC module 3 occupies a major part of the bottom surface of the IC module 3, even though the thickness of the peripheral part of the IC module 3 is reduced to some extent, the rigidity of the IC module 3 does not deteriorate and the IC chip incorporated in the IC module 3 is not damaged by the above-mentioned load.

The foregoing embodiments disclose the IC cards having an inclined gap 8 between the inside surface of the first concave 9 and the outside surface of the IC module 3, wherein the distance between the inside surface of the first concave 9 and the outside surface of the IC module 3 linearly narrows from the inside upper part toward the inside lower part of the first concave 9.

However, the IC cards of the invention are not limited to these embodiments. As far as a gap 8 which is wider in the outside upper part and narrower in the inside lower part of the first concave 9 exists between the inside surface of the first concave 9 and the outside surface of the IC module 3, in the middle part positioned between the inside upper part of the first concave 9 and the inside lower part of the first concave 9, the gap 8 between the inside surface of the first concave 9 and the outside surface of the IC module 3 can be formed in any shape such as a curve or steps.

Next, a manufacturing method of IC cards of the invention is described by mainly explaining the IC card of the embodiment in FIG. 1, referring to sectional views of the IC card shown in FIGS. 6 and 7.

Figure 6A:
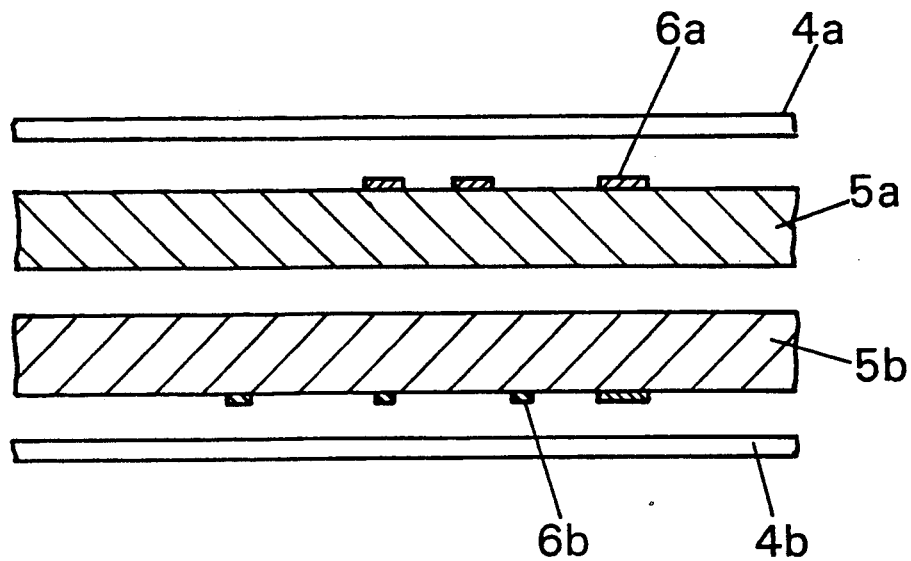
Figure 6B:
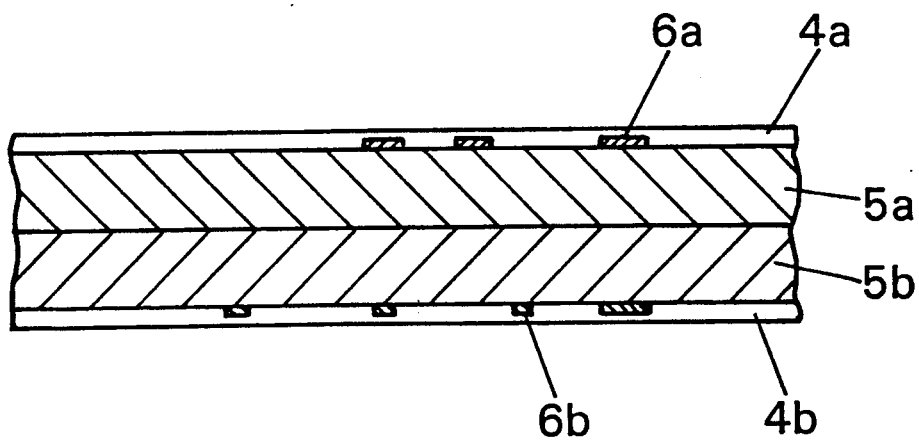
Figure 7A:
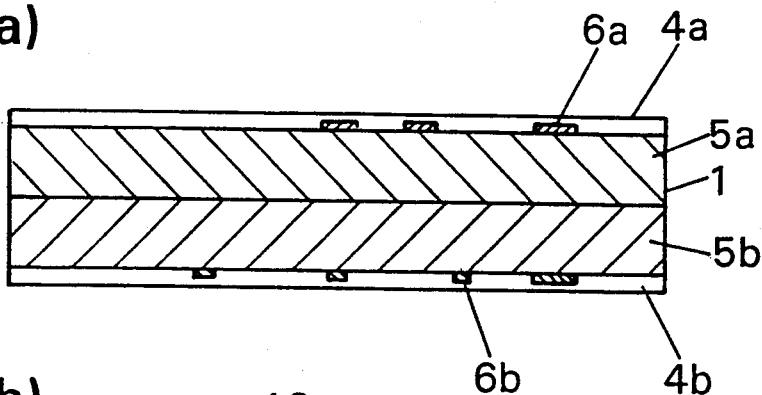
FIGS. 7a to d are sectional views showing methods for manufacturing an IC card of the invention.
Figure 7B:
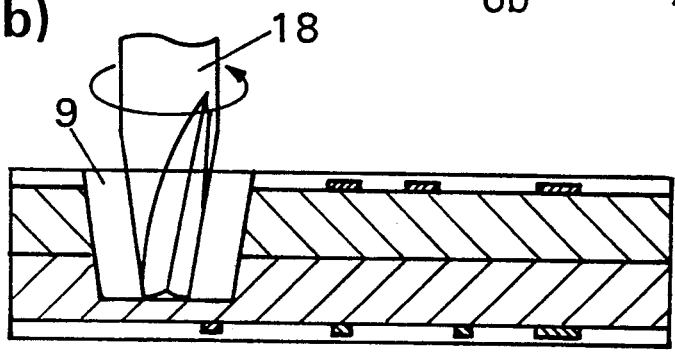
Figure 7C:
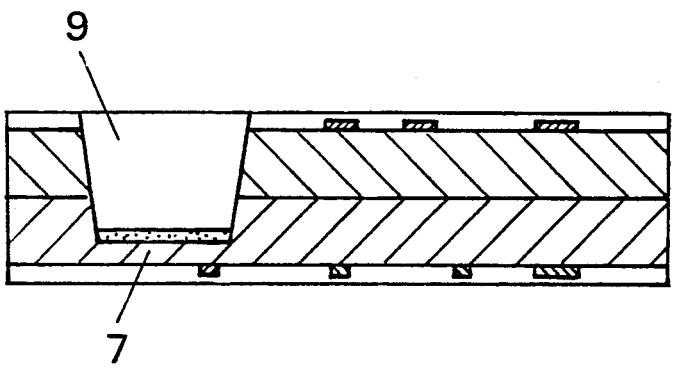

As a large sheet card material from which plural IC cards can be obtained, over-sheets 4a and 4b of 0.03 mm in thickness made of a transparent vinyl chloride resin and center cores 5a and 5b of 0.35 mm in thickness made of a white opaque rigid vinyl chloride resin are prepared. On the surfaces of the center cores 5a and 5b, logos, design letters and patterns 6a and 6b necessary for an IC card are formed with a thickness of 0.02 mm or less by a screen printing or offset printing technique (FIG. 6a). Next, the over-sheet 4b and the over-sheet 4a are placed on the top and in the bottom, respectively, and between these over-sheets 4a and 4b, the center cores 5a and 5b are stacked so that the letters and patterns 6a and 6b face to the over-sheets 4a and 4b, respectively, after which they are put between mirror-finished stainless steel plates, and heated to 100° C.–150° C. and cooled while applying a pressure of 15 to 35 Kg/cm$^2$ for several tens of minutes to obtain a large laminate of 0.76 mm in thickness (FIG. 6b). By cutting this laminate to separate it into individual IC cards and removing those having damage in the letters and patterns 6a and 6b or cards themselves, a card base 1 used for an IC card of the invention can be obtained (FIG. 7a). A protective layer of the over-sheets 4a and 4b of 0.01 mm or more in thickness is formed over the letters and patterns 6a and 6b, and a gap between the letters and patterns 6a and 6b and the center cores 5a and 5b are buried by the over-sheets 4a and 4b, thus the surface of the card base 1 is finished flat. Next, by using a numerically controlling drilling device equipped with a drill 18, a cutting treatment is executed to form the first concave 9 in a specified position of the card base 1 into which the IC module 3 is inserted (FIG. 7b). In the leading part and the peripheral part of the drill 18, a linear cemented carbide tip is disposed, and in the peripheral part, an inclination is formed so that the diameter of the drill 18 becomes smaller from the upper part to the leading part of the drill 18, which has an inclination of 10 deg., against the perpendicular. By driving the drill 18 at a high speed, lowering it to a specified depth from the surface of the card base 1, and then, relatively moving the drill 18 and the card base 1 in a horizontal direction in accordance with the shape of the first concave 9, the first concave 9 is formed. On the inside surface of the first concave 9, the inclination of the drill 18 is transcribed and an inclination of 10 deg. is formed inward toward the inside bottom surface of the first concave 9. In the case that the second concave 16 in the card base 1, such as that of the IC card of the embodiment of FIG. 5 is formed, the drill 18 is lowered again to a specified depth and the drill 18 and the card base 1 are relatively moved in a horizontal direction in accordance with the shape of the second concave 16. The outer dimensions of the inside bottom surface of the first concave 9 is 10.28×12.48 mm, the depth of the first concave 9 is 0.61 mm and the thickness of the remaining portion of the card base 1 that faces the first concave 9 is 0.15 mm. Thereafter, by using a dispenser, a few milligrams of the adhesive 7 that has a denaturated polymer of silicone as its main ingredient and that has a rubbery elasticity even after hardening is dropped on the inside bottom surface of the first concave 9 (FIG. 7c). The IC module 3 is molded by the transferring molding method with an outer size of 10.2 × 12.4 mm and a thickness of 0.59 mm, connection terminals 2, an IC chip 10 and metallic wires 11 being incorporated into the IC module in one body as shown in FIG. 2. In IC cards of the embodiments of FIGS. 4 and 5, the convexes 15 and 17 of the bottom surface of the IC module 3 are formed by conforming the inner shape of a mold used for the transferring molding method to the shapes of the convexes 15 and 17.

Then, the IC module 3 is inserted into the first concave 9 so that the connection terminal 2 exposes in the surface of the card base 1, and by using a pressing device, the surface of the IC module 3 is pressed for 30 to 40 sec., under a pressure of 3.8 to 6.2 g/mm$^2$.

The IC module 3 is smoothly inserted into the first concave 9 along the inclination constructed in the inside surface of the first concave 9, and in the inside lower part of the first concave 9, the gap 8 between the inside surface of the first concave 9 and the outside surface of the IC module 3 is narrow, so that the IC module 3 hardly moves inside of the first concave 9. Therefore, by simply dropping the IC module 3 into the first concave 9, the IC module 3 is precisely positioned in a specified position of the card base 1 without using a special device. Then the pressing is discontinued, the IC card is inserted in a magazine and heated for 40 to 70 mins., at a temperature of 45° to 55° C. to primarily harden the adhesive 7, and then successively leaving the card for 48 hours at room temperature, the adhesive 7 is secondarily hardened.

The thickness of the adhesive 7 is formed in 0.02 mm after it is completely hardened, and the thickness of the IC card becomes 0.76 mm.

Figure 7D:
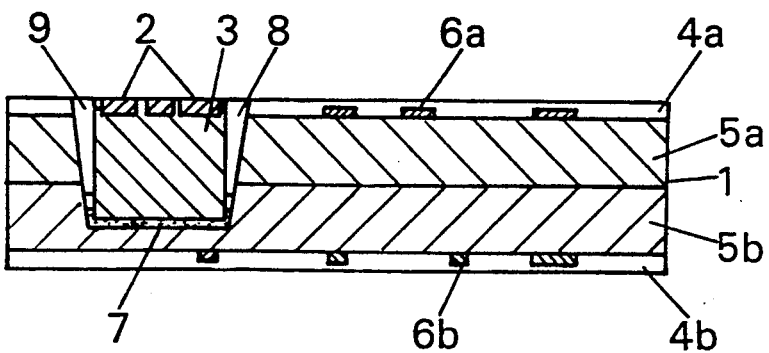
Figure 8:
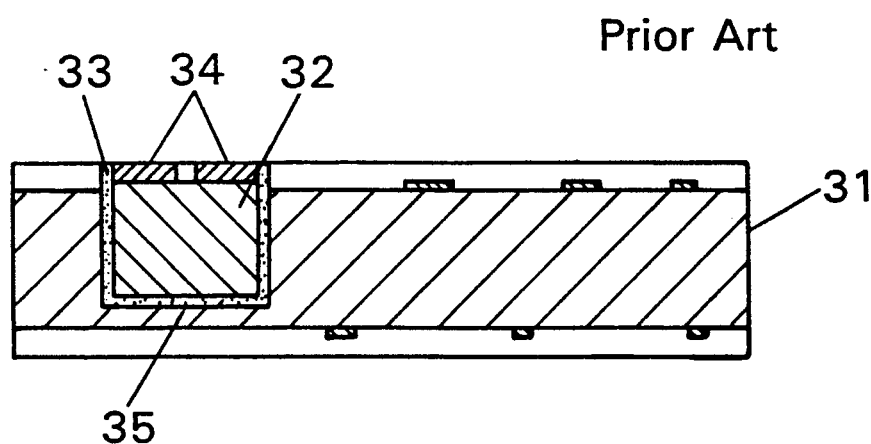
FIG. 8 is a sectional view showing a conventional IC card.

In such a way, an IC card of the invention, in which a linearly inclined gap 8 which is wider in the inside upper part and narrower in the inside lower part of the first concave 9 is formed between the inside surface of the first concave 9 and the outside surface of the IC module 3, is obtained (FIG. 7d). By this manufacturing method, the adhesive 7 is hardened at a temperature lower than the thermal deformation temperature of the card base 1 and only a very small pressure is applied to the IC module 3, so that any change in shape of the card base 1 or damage in the IC module 3 does not occur.

Industrial Applicability

As mentioned above, according to this invention, a gap which is wider in the inside upper part and narrower in the inside lower part of the first concave is formed between the inside surface of the first concave formed in the card base and the outside surface of the IC module constructed in the first concave, and even when the card base is bent, the inside surface of the first concave does not strongly press the outside surface of the IC module inward.

Therefore, the IC chip in the IC module and the card base itself are hardly damaged.

We claim:

1. An IC card comprising a flexible card base, an IC module constructed in a first recess formed in the card base and an adhesive adhering the IC module to the inside bottom surface of the first recess, the adhesive having sufficient elasticity to absorb stress caused by bending of the card base, the adhesive maintaining said elasticity after hardening, wherein a gap is formed between the inside surface of the first recess and the outside surface of the IC module, the difference between the inside surface of the first recess and the outside surface of the IC module gradually becoming narrower from the inside upper part of the first recess toward the inside lower part of the first recess, wherein a second recess is formed in the inside bottom surface of the first recess excluding a peripheral portion thereof, and a protrusion protruding toward the second recess is formed on the bottom surface of the IC module.

2. An IC card according to claim 1, wherein an adhesive containing a denaturated polymer of silicone as a main ingredient is used as an adhesive.

* * * * *